(12) United States Patent
Takita et al.

(10) Patent No.: US 6,188,597 B1
(45) Date of Patent: Feb. 13, 2001

(54) SEMICONDUCTOR MEMORY HAVING SUB-SELECT LINES CROSS-CONNECTED TO SUB-DECODERS

(75) Inventors: Masato Takita; Shinichi Yamada; Masato Matsumiya, all of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/540,877

(22) Filed: Mar. 31, 2000

(30) Foreign Application Priority Data

May 31, 1999 (JP) .................................................. 11-151053

(51) Int. Cl.[7] ...................................................... G11C 5/06

(52) U.S. Cl. ............................. 365/63; 365/51; 365/200; 365/201; 365/230.06; 365/227

(58) Field of Search ................................ 365/63, 51, 200, 365/233, 230.06, 201, 227

(56) References Cited

U.S. PATENT DOCUMENTS

| | | | | |
|---|---|---|---|---|
| Re. 36,531 | * | 1/2000 | Kuriyama et al. | 365/63 |
| 5,097,441 | * | 3/1992 | Cho et al. | 365/51 |
| 5,155,700 | * | 10/1992 | Min et al. | 365/63 |
| 5,379,247 | * | 1/1995 | Kuriyama et al. | 365/63 |
| 5,463,576 | * | 10/1995 | Kuriyama et al. | 365/63 |
| 6,034,879 | * | 3/2000 | Min et al. | 365/63 |

* cited by examiner

Primary Examiner—Andrew Q. Tran
(74) Attorney, Agent, or Firm—Arent Fox Kintner Plotkin & Kahn, PLLC

(57) ABSTRACT

In a semiconductor memory, sub-decoders in two adjacent sub-decoder groups are mirror-arranged with respect to the boundary between the two blocks. Sub-select lines are cross-connected to the sub-decoders in one sub-decoder group. This permits all sub-select lines connected to the two adjacent sub-decoder groups to be sequentially selected in a certain direction in accordance with a sequentially incremented address. Even when shift redundancy processing is performed, the order of selection of these sub-select lines does not reverse itself owing to the mirror arrangement.

14 Claims, 10 Drawing Sheets

Via Size : 0.3 μm
Gate Width : 0.3 μm
Gate-Via Space : 0.1 μm
Via-ISO Overlap : 0.1 μm
ISO Space : 0.3 μm

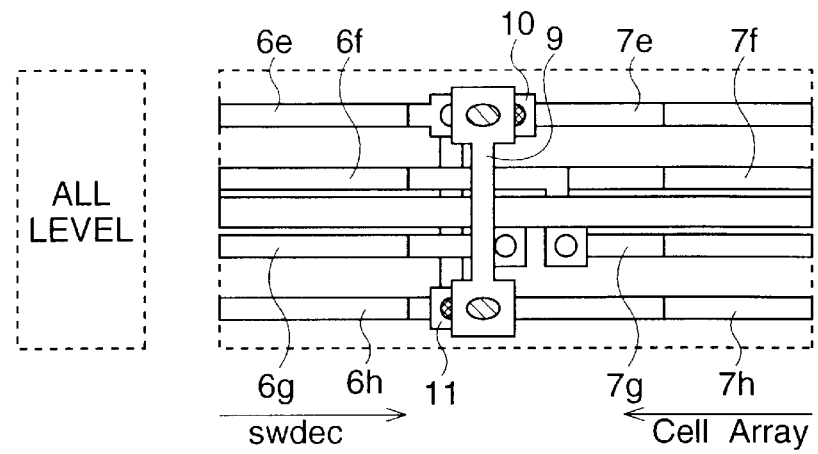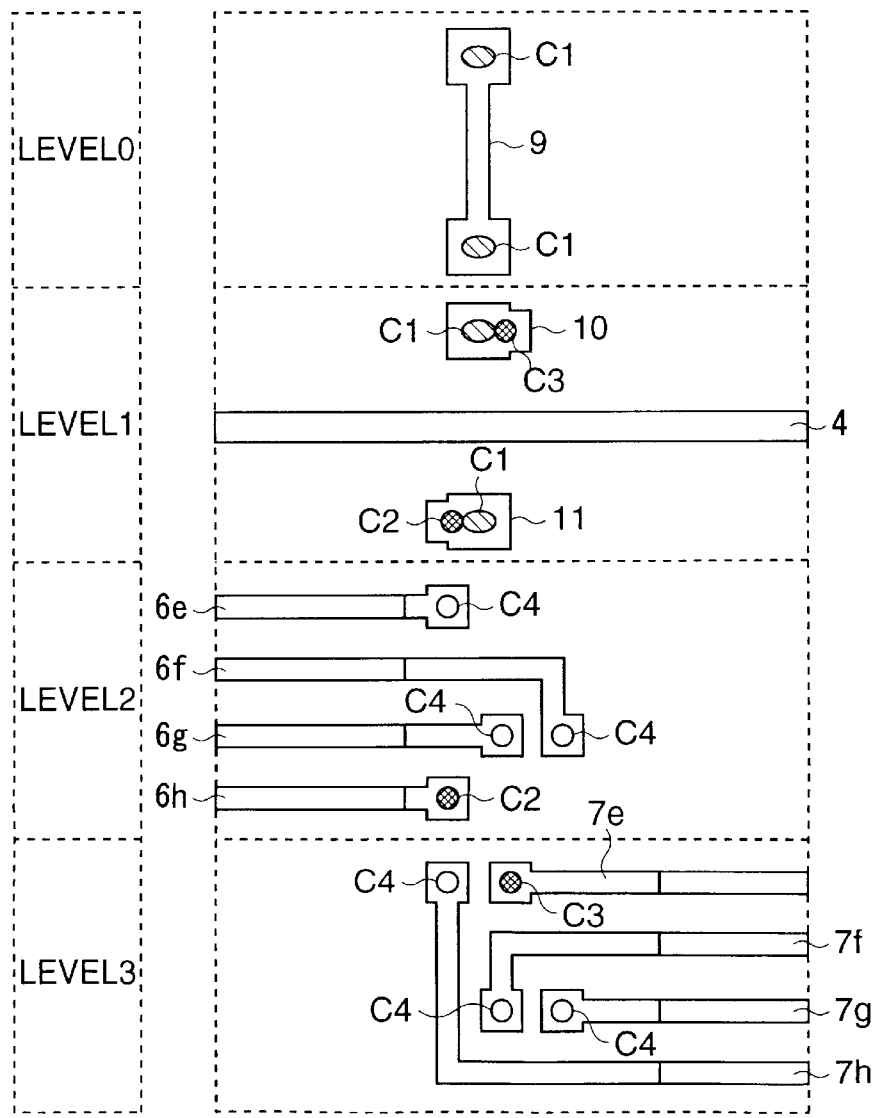

SEMICONDUCTOR MEMORY HAVING SUB-SELECT LINES CROSS-CONNECTED TO SUB-DECODERS

BACKGROUND OF THE INVENTION

1. Field of the Invention

The present invention relates to semiconductor memories, particularly to a semiconductor memory, such as a synchronous dynamic random-access memory (to be referred to as SDRAM hereinafter), using a shift redundancy system and formed by arranging decoding circuits of adjacent select lines (word lines) in a mirror image for the purpose of scale down.

2. Description of the Related Art

To increase the capacity and speed and reduce the consumption power of a memory and to reduce the wiring pitch by scale down, the general approach is to use a hierarchical word line system in a semiconductor memory such as SDRAM. In this hierarchical word line system, word lines are constituted by main select lines (mwl) and sub-select lines (swl). One select line selected by a main decoder (mwldec) is connected to a sub-decoder (swdec) having address information inputs for decoding and the corresponding sub-select line outputs. This sub-decoder selects one sub-select line in accordance with input address information.

For example, when eight sub-select lines belong to one main select line in a hierarchical word line system, to select one of these eight sub-select lines (⅛ selection), the sub-decoder performs ⅛-decoding to select one sub-select line from a main select line selected by the main decoder. For this purpose, eight sub-decoders are prepared for one main select line. Commonly, to reduce the circuit pitch, these eight sub-decoders are divided into two groups. Four sub-decoders are arranged at each end of a cell array block, and four sub-select lines run from these sub-decoders at one end alternately to oppose four corresponding sub-select lines at the other end in an interdigitated pattern.

In this arrangement, to place four sub-decoders within the pitch of eight sub-select lines, some layout improvements are made; four sub-decoders are grouped as one set, and signals and a power supply are shared by two adjacent sets. This is so because the size of a semiconductor integrated circuit is an important factor that determines the size of the whole system, so a reduction of the chip size by sharing is desired. Also, the smaller the chip size is, the larger the number of chips fabricated from one wafer is. Hence, it is essential to reduce the chip size by improving the layout efficiency.

To reduce the chip size in the hierarchical word line system, a method is known by which adjacent decoding circuits or decoding circuit sets are arranged in a mirror image (mirror arrangement or symmetrical arrangement) so that at least some decoding circuits or decoding circuit sets of word lines for selecting memory cells are shared. That is, a sharable portion is formed in a pitch end portion of each decoding circuit or decoding circuit set, and decoders are constituted by turning them back at these sharable portions.

FIGS. 1A and 1B are plan views for explaining the effect of space reduction by the mirror arrangement of decoding circuits. FIG. 1A shows a common shift arrangement, not a mirror arrangement, of adjacent decoding circuits. FIG. 1B shows a mirror arrangement of adjacent decoding circuits.

As shown in FIG. 1B, when two decoding circuits are mirror-arranged, the ground electrode (GND) can be shared by these decoding circuits. This can reduce the space in a direction perpendicular to word lines compared to the shift arrangement as shown in FIG. 1A. In this example, the space of two decoders in the direction perpendicular to word lines is 3.2 $\mu$m in the shift arrangement, whereas this space can be reduced to 2.4 $\mu$m in the mirror arrangement. That is, a space reduction of 0.8 $\mu$m is achieved.

Semiconductor memories such as SDRAMs are mass-produced because of their characteristics as products, and it is necessary strictly to guarantee the quality of each individual product. To guarantee this quality, various tests and evaluations are conducted before the shipment of products. The time required for these tests and evaluations is an important factor for determining the fabrication cost.

In guaranteeing the quality of a semiconductor memory, a shift redundancy system is known as a method of remedying defectives occurring in memory cells or word lines. In this shift redundancy system, the address of a main select line or a sub-select line is shifted one bit to the higher or lower bit position from a defective portion. In this system, address information on a defective location to be subjected to redundancy processing is loaded upon start-up of a device. In accordance with this address information, the relationships between decoders and drivers of select lines are appropriately switched, so that the defective address portion is not selected. Accordingly, no redundancy determination is necessary from the subsequent access, so it is possible to increase the access speed and reduce the consumption power. This address information of a defective portion is previously stored in an internal ROM or the like of a memory. Even if a memory cell or the like has a defect, therefore, by redundancy processing, the memory can be operated normally, without selecting this defective memory cell.

This shift redundancy system will be described below with reference to FIGS. 2 to 4. FIGS. 2 to 4 are enlarged plan views of a cell array portion and a sub-decoder portion. In FIGS. 2 to 4, not only sets of four sub-decoders but also sub-decoders in each set are mirror-arranged. Of an externally input row address, a lower address (3 bits) is used to select a sub-decoder, and an address higher than that is used to select a main decoder.

When the lower bit address is incremented from 0, sub-select lines swl<0> to swl<31> juxtaposed from the upper end to the lower end of FIG. 2 are sequentially selected as indicated by their numbers. Even when the externally given address is sequentially incremented, these select lines are not sequentially selected from the end as shown in FIG. 2. This is so because adjacent sub-decoders are mirror-arranged, so the order of addresses on the device is inconsistent with the order of externally supplied addresses.

Sub-decoders on the right-hand side of the cell array in FIG. 2 are laid out such that sub-decoders 51 to 54 selected by main select line <0> (mwl<0>) and sub-decoders 55 to 58 selected by a main select line <1> (mwl<1>) are mirror-arranged with respect to the boundary between the sub-decoders 54 and 55.

Furthermore, of one set of the sub-decoders 51 to 54 selected by main select line <0> (mwl<0>), the sub-decoders 51 and 52 and the sub-decoders 53 and 54 are mirror-arranged with respect to the boundary between the sub-decoders 52 and 53. Sub-decoders selected by the other main select lines <1> (mwl<1>) to <3> (mwl<3>) are similarly mirror-arranged.

Accordingly, the sub-decoder 58 placed symmetrically with the sub-decoder 51 with respect to the boundary between the sub-decoders 54 and 55 is composed of transistors having the same configuration as the sub-decoder 51 and is selected by the same address signal. This also holds true for pairs of the sub-decoders 52 and 57, 53 and 56, and 54 and 55; these sub-decoders of each pair are symmetrically arranged with respect to the boundary and selected on the basis of the same address signal.

The sub-select lines connected to the sub-decoders located on the right-hand side of FIG. 2 are selected in the order of swl<0>, sw2<2>, swl<4>, and swl<6> by supplying four address signals by selecting main select line <0>. After that, main select line <1> is selected to supply address signals in the same order. As a consequence, these sub-select lines are selected in the order as shown in FIG. 2.

To test and evaluate a semiconductor memory, it is sometimes necessary to select sub-select lines regularly in a certain direction, in order to write data in the form of a specific pattern by a physical image in the storage of a memory cell to check the influence on adjacent memory cells, to check the influence when a memory cell at a specific distance from a memory cell of interest is repeatedly accessed, or to allow easy progress of an analysis when defects have occurred. For this purpose, arithmetic processing is sometimes done for addresses generated by an IC tester to select sequentially these sub-select lines in accordance with their positions.

FIG. 3 shows an example in which arithmetic processing is performed for externally applied addresses. In this example, a lower address of a row address is used as a selection address of a sub-decoder, a higher address of the row address is used as a selection address of a main decoder, and the address is incremented from lower bits. Sub-select lines swl<0> to swl<16> juxtaposed from the upper end to the lower end of FIG. 3 are selected in the order of numbers in parentheses shown in FIG. 3.

As described above, sub-select lines can be sequentially selected in a certain direction by performing predetermined arithmetic processing for addresses generated from an IC tester.

For example, this arithmetic processing performed for addresses generated by an IC tester is as follows:
RA0=A0 XOR A1
RA1=A1 XOR A2
RA2=A2 XOR A3
RA3=A3
RA4=A4
. . .

In the above arithmetic processing, A0, A1, . . . , are original addresses generated by an IC tester, and these addresses are incremented. RA0, RA1, . . . , are addresses after the logical operation, which the IC tester actually supplies to the device.

In a memory in which sub-decoders are mirror-arranged as described above, sub-select lines can be sequentially selected in accordance with their physical positions by previously arithmetically processing addresses generated by an IC tester and supplying the obtained addresses to the device. Accordingly, it is readily possible to obtain the correspondence between the sequentially incremented addresses and the actually selected sub-select lines. This allows accurate testing/evaluation of a semiconductor memory.

Unfortunately, when addresses generated by an IC tester are given to a device after being arithmetically processed as shown in FIG. 3, the following problem arises if shift redundancy processing is performed.

As shown in FIG. 4, assume that a defect has occurred in a block of main select line <1> and so main select lines are shifted one bit downward in FIG. 4 in order to perform a defect remedy process. In this case, if an address is incremented by performing the aforementioned arithmetic processing by an IC tester, the order of selection of sub-select lines changes as indicated by the numbers in parentheses of FIG. 4.

Referring to FIG. 4, X marks indicate that sub-select lines belonging to defective main select line <1> are not selected. That is, these select lines are not selected because redundancy processing is performed.

As is apparent from this FIG. 4, in a block of main select line <0> before defective main select line <1>, sub-select lines are selected in order from the uppermost one. However, in blocks of main select lines <2> and <3> after defective main select line <1>, the order of selection of sub-select lines reverses itself. This reverse itself selection occurs because eight sub-decoders selected by main select line <1> are mirror-arranged with respect to eight sub-decoders selected by main select line <2>. That is, when main select line <1> is subjected to redundancy processing, address signals for the sub-decoders belonging to this main select line <1> are directly input to the sub-decoders belonging to main select line <2>. This reverses itself the order of selection of these sub-decoders.

When addresses from an IC tester are given to a device after being arithmetically processed as described above, sub-select lines after defective main select line <1> are no longer sequentially selected in accordance with their physical positions. This makes it difficult to establish the correspondence between the addresses generated by the IC tester and the actually selected sub-select lines. Consequently, it becomes impossible to perform accurate testing/evaluation.

As described above, when the conventional system is used in a semiconductor memory having mirror-arranged sub-decoders, to select sub-select lines in the intended order in testing/evaluation or the like, it is necessary previously to process input addresses arithmetically. Even when the arithmetically processed addresses are input, sub-select lines cannot be selected in a predetermined order if defect remedy is performed by shift redundancy processing.

The following means must be used to prevent this selection order change due to the presence/absence of redundancy.

The presence/absence of redundancy or a bit subjected to redundancy processing changes in accordance with the presence/absence of a defect or the location of a defect in each chip. To control all possible cases in the stage of testing/evaluation, address logical arithmetic expressions to be selected in accordance with the location of a defect are prepared and: (a) address information of a bit subjected to redundancy processing is checked whenever testing/evaluation is performed, and an appropriate address logical arithmetic expression corresponding to the address information is chosen; or (b) information on a defective address used when redundancy processing is performed is stored, and this information is extracted to select an appropriate address logical arithmetic expression and start testing/evaluation.

In the above method (a), however, it is necessary to recheck the defect address, and this requires a long testing/evaluation time. As a consequence, the testing/evaluation cost rises. In the method (b), defect address information of each device must be stored in a certain storage device, resulting in an increase in the cost of hardware resources. An enormous cost rise results when the number of devices to be processed increases.

Furthermore, in both methods (a) and (b), it is necessary to prepare logical arithmetic expressions for address conversion for all possible combinations and define proper correspondence between defect addresses and these logical arithmetic expressions. This requires very cumbersome work. Also, actual redundancy processing requires troublesome processing, e.g., selecting an appropriate logical arithmetic expression by referring to the contents of the aforementioned definition.

SUMMARY OF THE INVENTION

The present invention has been made in consideration of the above situation and aims to be able to establish, in a semiconductor memory in which decoding circuits of select lines are arranged in a mirror image manner, correspondence between input addresses and actually selected decoding circuits (select lines) even when shift redundancy processing is performed, without increasing the cost or performing any cumbersome processing.

A semiconductor memory according to the present invention comprising select lines coupled to memory cells, decoders for selecting one of the select lines, and connection lines, each connected between one of the select lines and one of output nodes of the decoders, and wherein at least two of the connection lines are cross coupled such that position of selected one of the select lines is shifted in order along a first direction in response to shifting an address signal.

Preferably in the semiconductor memory, the decoders includes a first and second decoder group which are adjacent each other and arranged to have a mirror image relationship.

Preferably in the semiconductor memory, the connection lines includes first and second connection lines, the first connection lines connected between corresponding the select lines and the first decoder group and the second connection lines connected between corresponding the select lines and the second decoder group, and at least part of the first connection lines and at least part of the second connection lines are cross coupled.

The semiconductor memory preferably further comprising main select lines, each selectively coupling one of the select lines, wherein the first decoder group comprises first decoders connected to one of the main select lines, and the second decoder group comprises second decoders connected to another one of the main select lines.

Preferably in the semiconductor memory, the semiconductor memory having a first wiring layer and a second wiring layer arranged above the first wiring layer, and the two of the connection lines are disposed at the first and second wiring layer respectively.

A semiconductor memory according to the present invention comprising word lines coupled to memory cells, word decoders for selecting the word lines, and connection lines, each connected between an output node of corresponding one of the word decoders and corresponding one of the word lines, wherein at least two of the connection lines are cross coupled each other.

Preferably in the semiconductor memory, the at least two of the connection lines are cross coupled such that position of selected word line is sequentially shifted in response to shift of an address signal.

The semiconductor memory preferably further comprising main word lines, wherein the word decoders are selectively connected corresponding word lines with the main word lines in response to selection signals.

A semiconductor memory according to the present invention comprising first word lines coupled to corresponding memory cells, second word lines coupled to corresponding memory cells, a first decoder group including first word decoders for selecting the first word lines, a second decoder group including second word decoders for selecting the second word lines, first connection lines, each connected between an output node of corresponding one of the first word decoders and corresponding one of the first word lines, second connection lines, each connected between an output node of corresponding one of the second word decoders and corresponding one of the second word lines, wherein at least two among the first and second connection lines are cross coupled each other.

Preferably in the semiconductor memory, the at least two among the first and second connection lines are cross coupled such that position of selected word line is sequentially shifted in response to shift of an address signal.

Preferably in the semiconductor memory, at least two of either of the first connection lines or the second connection lines are cross coupled each other.

Preferably in the semiconductor memory, at least two of the first connection lines and at least two of the second connection lines are cross coupled each other.

Preferably in the semiconductor memory, the first and second decoder group are arranged to have a mirror image relationship.

The semiconductor memory preferably includes a memory cell array in which the word lines are located, and wherein the first and second decoder group are disposed on both side of the memory cell array.

Since the present invention comprises the above technical means, the select lines connected to the decoders arranged to have the mirror image relationship are selected in order in the certain direction on the basis of the sequentially applied address signals. Therefore, even when a defective portion undergoes redundancy processing, these select lines can always be selected in the same order.

In the present invention, the connecting lines are switched in at least one of the input and output portions of the mirror-arranged decoders. Hence, the order of selection of the select lines can always be made proper regardless of the presence/absence of redundancy based on defects. Additionally, it is unnecessary to check each individual defect address or to pre-store necessary information in a memory. Consequently, it is possible to reduce particularly the time required for testing/evaluation in device fabrication and reduce the hardware for storing defect addresses and the like. Accordingly, the cost of the semiconductor memory can be reduced.

BRIEF DESCRIPTION OF THE DRAWINGS

FIGS. 8A and 8B are plan views showing practical connecting portions between sub-decoder groups and sub-select lines in the first embodiment;

DETAILED DESCRIPTION OF THE PREFERRED EMBODIMENTS

First Embodiment

Figure 5:
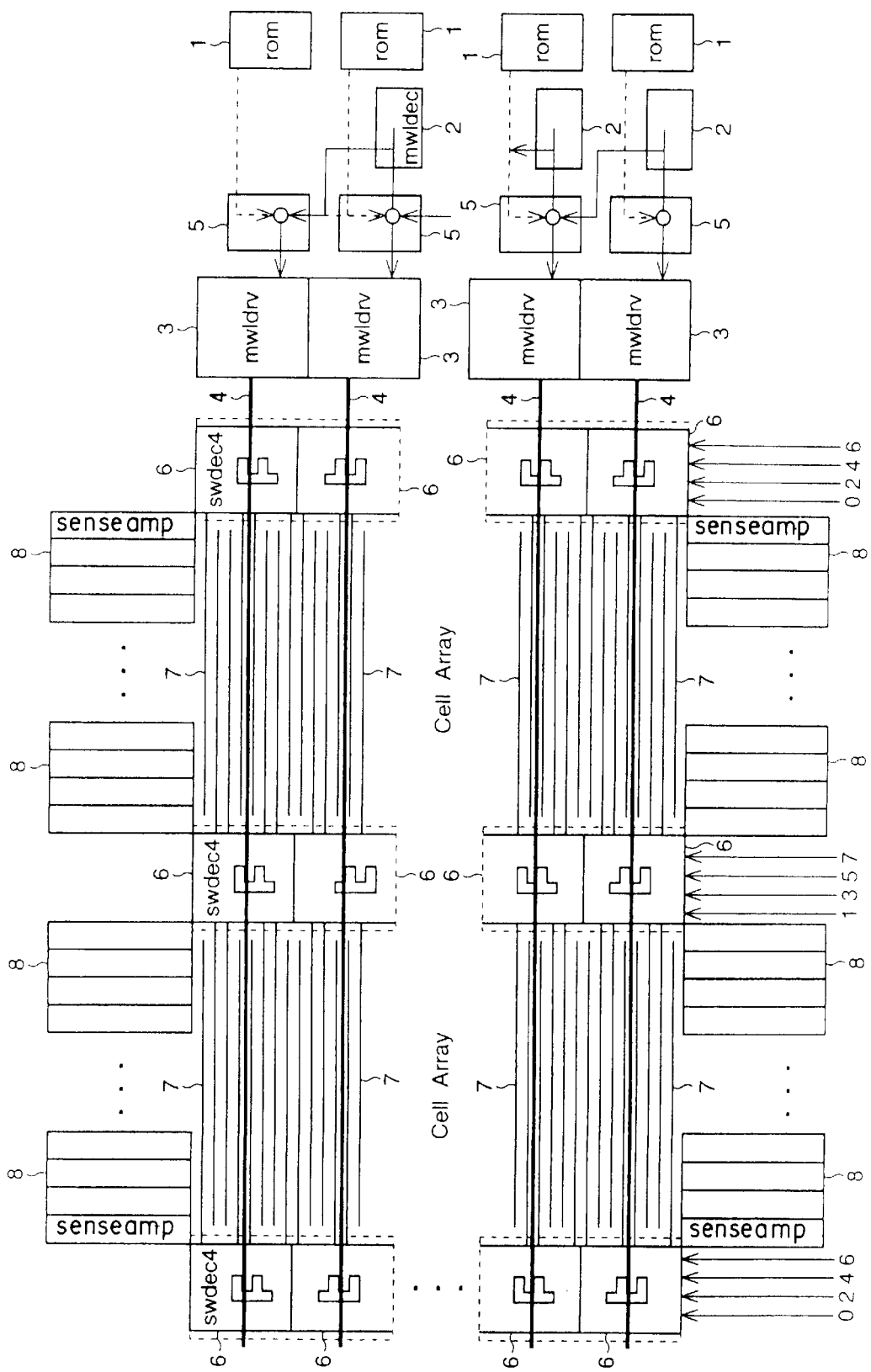
FIG. 5 is a plan view showing an outline of the arrangement of SDRAM as a semiconductor memory according to an embodiment of the present invention.

The first embodiment of the present invention will be described below with reference to drawings. FIG. 5 is a plan view showing an outline of the arrangement of a cell array block unit of SDRAM as a semiconductor memory according to the first embodiment. FIGS. 6A to 6D are schematic views showing the connections between sub-decoders and sub-select lines in the cell array block unit of the SDRAM shown in FIG. 5. Referring to FIGS. 6A to 6D, two sets of four sub-decoders are mirror-arranged and sub-decoders in each set are not mirror-arranged, for the sake of simplicity.

Figure 1B:
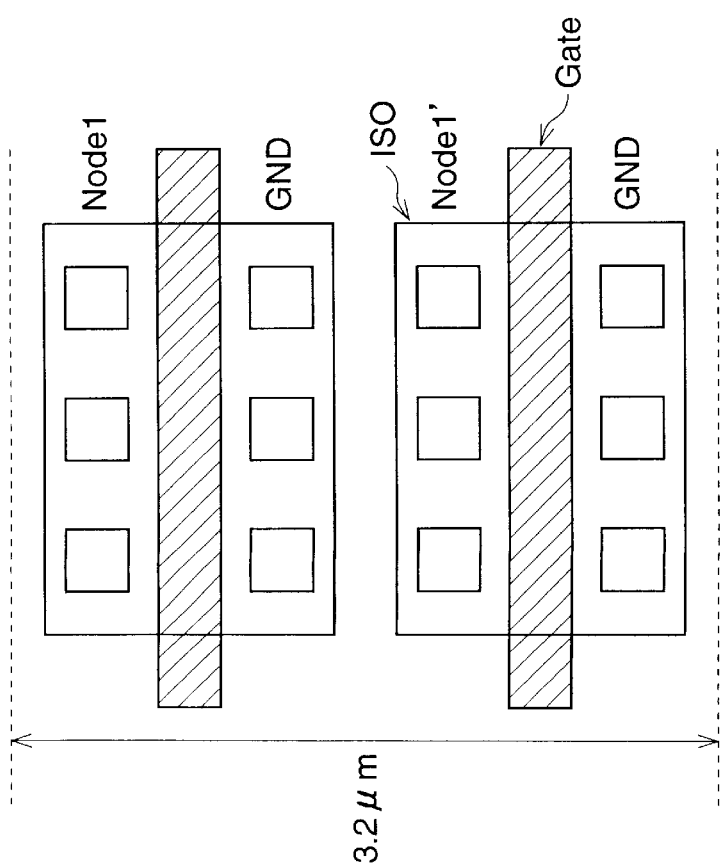
FIGS. 1A and 1B are plan views showing an example of the effect of space reduction obtained by a mirror arrangement of decoding circuits.
Figure 1A:
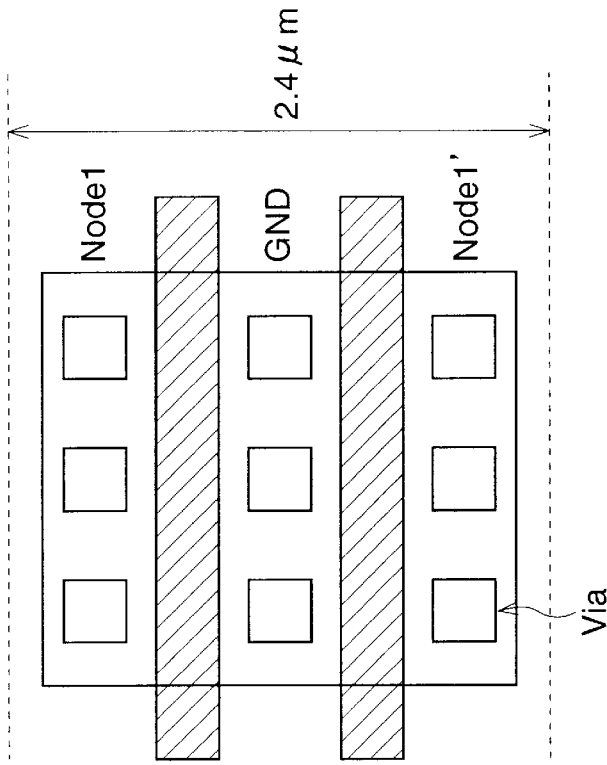
Figure 2:
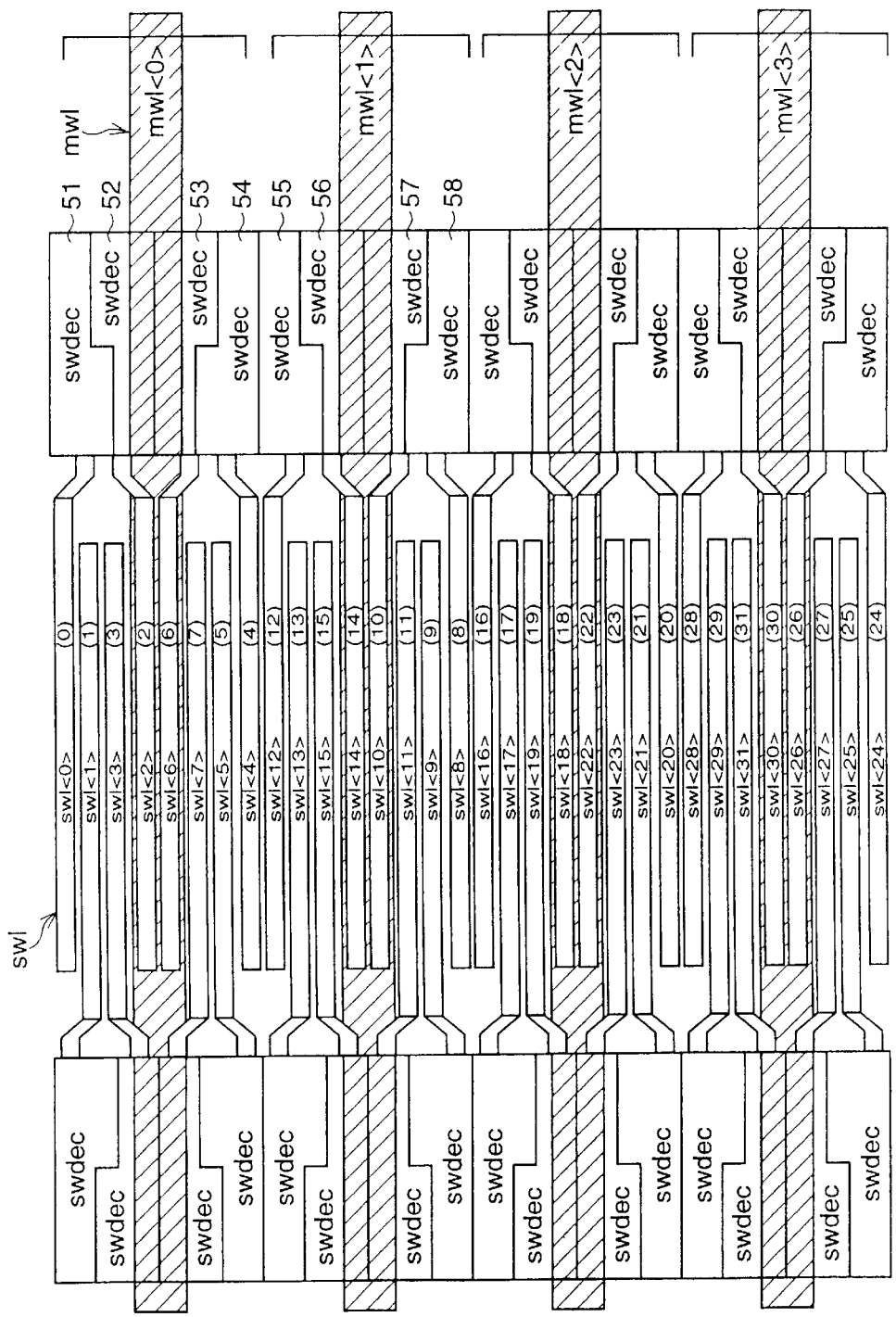
FIG. 2 is a plan view showing the order of selection of sub-select lines in address increment in a conventional semiconductor memory.
Figure 3:
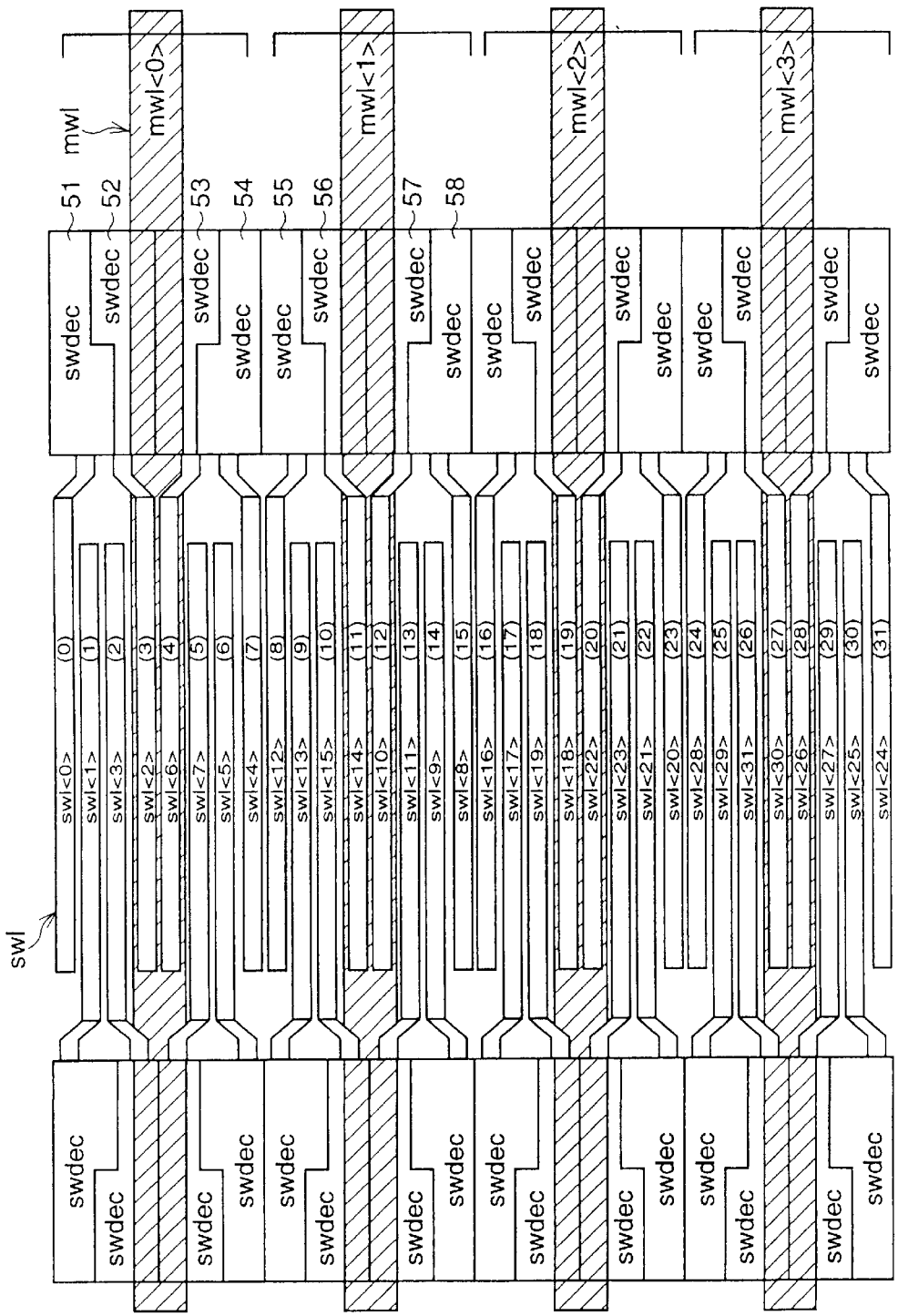
FIG. 3 is a plan view showing the order of selection of sub-select lines when arithmetically processed addresses are input in the conventional semiconductor memory.

First, the arrangement of the SDRAM will be described with reference to FIG. 5. In this SDRAM, a hierarchical word line system is used to perform ⅛ selection of sub-select lines from one main select line. Eight sub-decoders for this ⅛ selection are arranged such that four sub-decoders are placed at each end of a cell array, and eight sub-select lines are driven in an interdigitated pattern. As in the semiconductor memory explained with reference to FIGS. 2 to 4, sub-decoders are mirror-arranged, and a shift redundancy system is used as a defect remedy system for main select lines.

Referring to FIG. 5, a read-only memory (rom) 1 stores the presence/absence of redundancy and address information on an object when redundancy processing is to be performed. A main decoder (mwldec) 2 is a block for selecting one main select line driver (mwldrv) 3. This main select line driver 3 is a block for driving a main select line (mwl) 4 in accordance with a selected main decoder 2. A system controller 5 is a block for constructing an appropriate connection between the main decoder 2 and the main select line driver 3 on the basis of the stored information of the rom 1.

A sub-decoder group (swdec4) 6 is a block for driving one of sub-select lines 7 (in FIG. 5, eight lines) connected to the main select line 4 selected by the main decoder 3. That is, one sub-decoder group 6 includes four sub-decoders, and one of the eight sub-select lines 7 connected in an interdigitated pattern to two sub-decoder groups 6 at the two ends of the cell array is selected. A sense amplifier (senseamp) 8 is a block for amplifying stored data read from a memory cell.

Figure 6B:
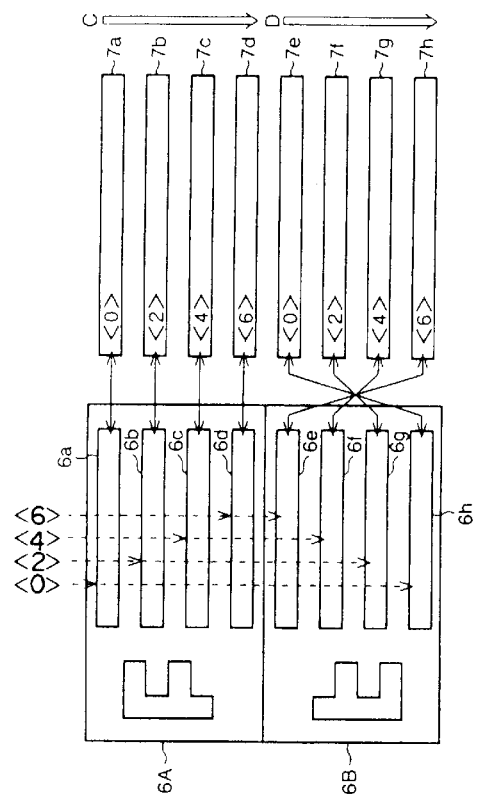
FIGS. 6A to 6D are schematic views showing the connections between sub-decoders and sub-select lines in a cell array of the SDRAM shown in FIG. 5.
Figure 6C:
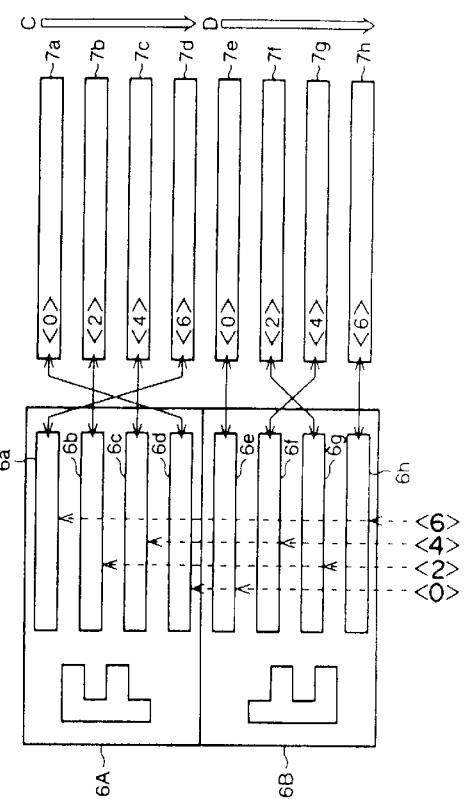
Figure 6A:
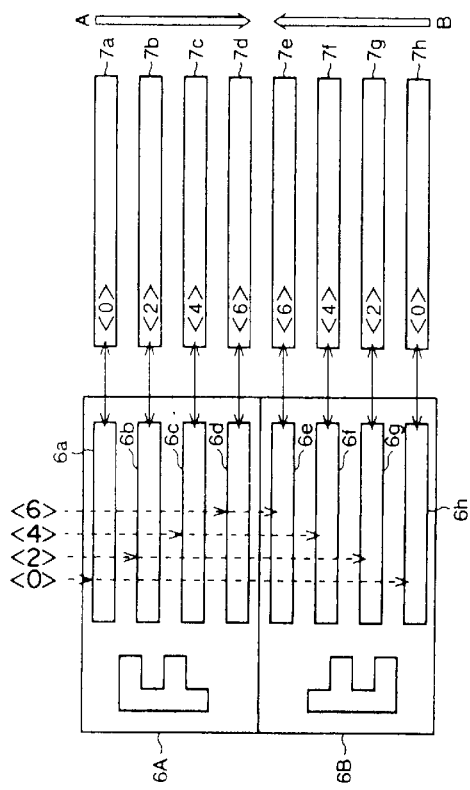

FIGS. 6A to 6D are enlarged plan views showing connecting portions between sub-decoder groups 6A and 6B and sub-select lines 7a to 7h in the cell array block unit shown in FIG. 5. FIG. 6B shows the first embodiment, and FIG. 6A shows a comparative example of this first embodiment. First, selection of the sub-select lines 7a to 7h connected to the two adjacent sub-decoder groups 6A and 6B will be described below with reference to the comparative example of FIG. 6A.

Referring to FIG. 6A, the adjacent sub-decoder groups 6A and 6B are arranged to have a mirror relationship. A mirror relationship means that the basic structures of these adjacent sub-decoder groups 6A and 6B are arranged to have a mirror relationship (mirror image relationship). So, connecting lines and the like need not be mirror-arranged. Four types of address signals, i.e., signals <0>, <2>, <4>, and <6>, are input to these sub-decoder groups 6A and 6B arranged on one side of the cell array. These signals correspond to the four sub-select lines 7a to 7d connected to sub-decoders 6a to 6d in the sub-decoder group 6A and the four sub-select lines 7h to 7e connected to sub-decoders 6h to 6e in the sub-decoder group 6B.

Since the two adjacent sub-decoder groups 6A and 6B are mirror-arranged, input address signal <0> corresponds to the sub-connecting line 7a connected to the sub-decoder 6a and the sub-connecting line 7h connected to the sub-select line 6h, as shown in FIG. 6A. Input address signal <2> corresponds to the sub-connecting line 7b connected to the sub-decoder 6b and the sub-connecting line 7g connected to the sub-select line 6g. Analogously, input address signal <4> corresponds to the sub-connecting line 7c connected to the sub-decoder 6c and the sub-connecting line 7f connected to the sub-select line 6f. Input address signal <6> corresponds to the sub-connecting line 7d connected to the sub-decoder 6d and the sub-connecting line 7e connected to the sub-select line 6e.

Figure 4:
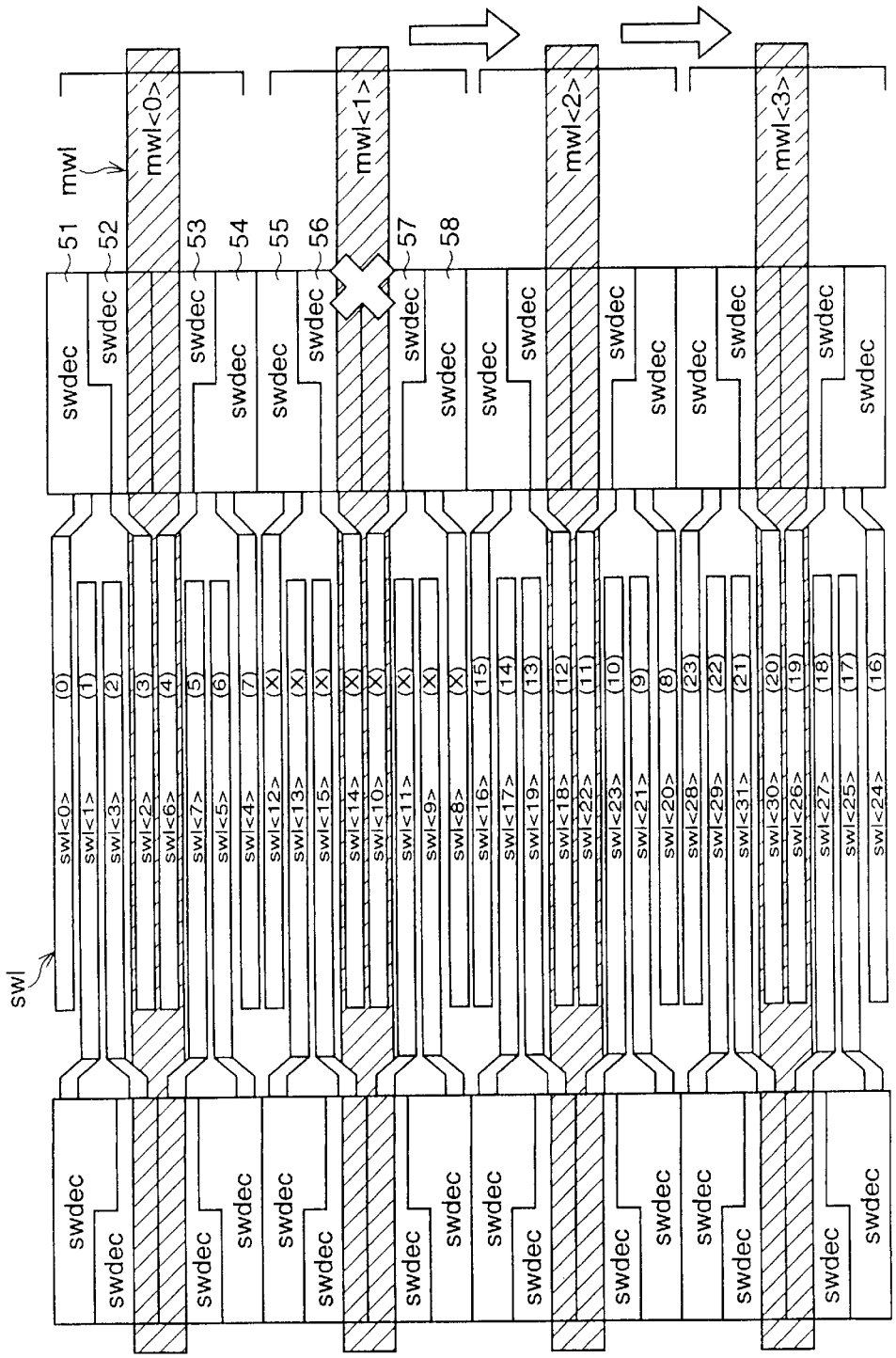
FIG. 4 is a plan view showing the order of selection of sub-select lines when shift redundancy processing is performed in the conventional semiconductor memory.

In this arrangement, when the sub-decoder group 6A is selected by one main select line 4 and sequentially given address signals <0>, <2>, <4>, and <6> for sub-decoder groups and then the sub-decoder group 6B is selected by another main select line 4 and sequentially given address signals <0>, <2>, <4>, and <6>, the sub-select lines 7a to 7d are selected in the order indicated by an arrow A, and subsequently the sub-select lines 7e to 7h are selected in the order indicated by an arrow B. As explained in FIG. 3, therefore, to sequentially select the sub-select lines 7a to 7h in a certain direction, it is necessary to supply address signals subjected to a predetermined logical arithmetic operation. If shift redundancy processing is performed, the order of selection reverses itself as shown in FIG. 4.

In contrast to this, in the first embodiment as shown in FIG. 6B, the sub-select lines 7e to 7h are cross-connected to the sub-decoders 6e to 6h in the sub-decoder group 6B as one of the two mirror-arranged sub-decoder groups. More specifically, in FIG. 6B, the sub-decoder 6e at the upper end of the sub-decoder group 6B is connected to the sub-select line 7h at the lower end of the sub-select lines 7e to 7h. The sub-decoder 6f as the second one from the upper end of the sub-decoder group 6B is connected to the sub-select line 7g as the second one from the lower end of the sub-select lines 7e to 7h. The sub-decoder 6g as the third one from the upper end of the sub-decoder group 6B is connected to the sub-select line 7f as the third one from the lower end of the sub-select lines 7e to 7h. The sub-decoder 6h at the lower end of the sub-decoder group 6B is connected to the sub-select line 7e at the upper end of the sub-select lines 7e to 7h.

That is, address signals <0> to <6> are input to the sub-decoders 6a to 6h in the same manner as in FIG. 6A. However, connections to the sub-select lines 7e to 7h are switched at the outputs of the sub-decoders 6e to 6h so that these sub-select lines are selected in a certain direction when address incrementing is performed. Accordingly, the sub-select lines 7e, 7f, 7g, and 7h connected to the sub-decoder group 6B are selected by input address signals <0>, <2>, <4>, and <6>, respectively.

The sub-select lines 7a to 7d are connected to the sub-decoders 6a to 6d in the sub-decoder group 6A in the same manner as in the comparative example of FIG. 6A. Therefore, in the arrangement according to the first embodiment shown in FIG. 6B, when the sub-decoder group 6A is selected by the main select line 4 and sequentially given address signals <0>, <2>, <4>, and <6> and then the sub-decoder group 6B is selected and sequentially given address signals <0>, <2>, <4>, and <6>, the sub-select lines 7a to 7d are selected in the order indicated by an arrow C, and subsequently the sub-select lines 7e to 7h are selected in order in the same direction (arrow D).

As described above, the sub-select lines 7e to 7h are cross-connected to the sub-decoders 6e to 6h in the sub-decoder group 6B. Consequently, sub-select lines (e.g., the sub-select lines 7a and 7e) in corresponding positions in the adjacent sub-decoders 6A and 6B are selected on the basis of the same input address signal.

Figure 7:
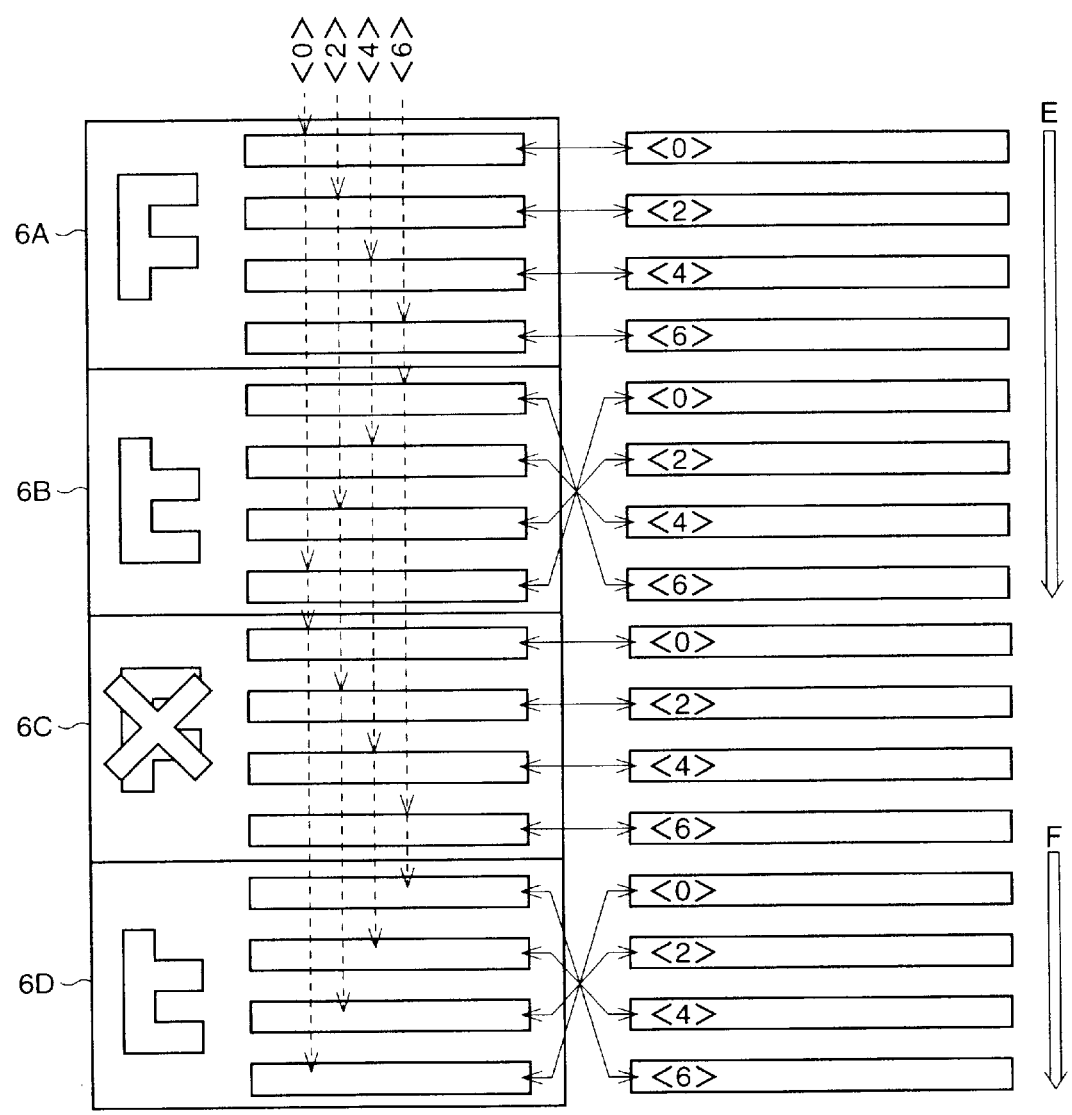
FIG. 7 is a plan view showing the arrangement of four sub-decoder groups in the first embodiment.

FIG. 7 shows an arrangement in which sub-decoder groups 6C and 6D having the same configuration as the sub-decoder groups 6A and 6B shown in FIG. 6B are juxtaposed with these sub-decoder groups 6A and 6B. The sub-decoder group 6A is selected first and sequentially given address signals <0>, <2>, <4>, and <6>, and then the sub-decoder group 6B is selected and sequentially given address signals <0>, <2>, <4>, and <6>, so as to select sub-select lines in the direction indicated by an arrow E. Assume that the sub-decoder group 6C undergoes redundancy processing when the sub-decoder groups 6C and 6D are similarly selected after that. Even in this case, sub-select lines in the sub-decoder group 6D after the redundant portion are always selected in the direction indicated by an arrow F in FIG. 7. This prevents the reversal of the order of selection of sub-select lines even when shift redundancy processing is performed. That is, sub-select lines can always be selected in a predetermined order in a certain direction. Consequently, it is possible to establish reliably the correspondence between addresses input to the device and actually selected sub-select lines when testing or evaluation is performed.

FIGS. 8A and 8B are plan views showing practical connecting portions of the sub-select lines 7e to 7h with respect to the sub-decoder group 6B shown in FIG. 6B. FIG. 8A is a plan view showing all hierarchical layers (all levels) of the connecting portions from the above. FIG. 8B is a plan view showing individual hierarchical layers (levels 0 to 3). In FIG. 8B, level 0 indicates the uppermost hierarchical layer. Level 1 is a hierarchical layer which is lower than level 0 and in which the main select lines 4 are formed. Level 2 is a hierarchical layer which is lower than level 1 and in which bit lines are formed. Level 3 is a hierarchical layer which is lower than level 2 and in which the sub-select lines 7 are formed.

Referring to FIG. 8B, contact windows C1 are connecting portions for forming contacts between levels 0 and 1. Contact windows C2 are connecting portions for forming contacts between levels 1 and 2. Contact windows C3 are connecting portions for forming contacts between levels 1 and 3. Contact windows C4 are connecting portions for forming contacts between levels 2 and 3.

As shown in FIG. 8B, the four sub-select lines 7e to 7h are formed in the same hierarchical layer (level 3) and connected to the sub-decoders 6e to 6h formed in the same hierarchical layer (level 2) above these sub-select lines 7e to 7h. Since the sub-decoder 6e is connected to the sub-select line 7h, this sub-select line 7h bends into an L shape to run up to a portion below the connecting line of the sub-decoder 6e. At the end of this sub-select line 7h, the contact window C4 forms a vertical contact.

Since the sub-decoder 6f is connected to the sub-select line 7g, the connecting line of this sub-decoder 6f runs up to a portion above the end portion of the sub-select line 7g. In this position, the contact window C4 forms a vertical contact. Analogously, the sub-decoder 6g is connected to the sub-select line 7f, so this sub-select line 7f bends into an L shape to run up to a portion below the end portion of the connecting line of the sub-decoder 6g. In this position, the contact window C4 forms a vertical contact.

Although the sub-decoder 6h is connected to the sub-select line 7e, the sub-decoders 6e to 6g interfere with this connection. Hence, the sub-decoder 6h and the sub-select line 7e are connected through a line 9 formed in the uppermost hierarchical layer (level 0) and pads 10 and 11 formed in the hierarchical layer (level 1) below level 0. That is, the sub-decoder 6h is connected to the pad 11 in the upper layer (level 1) through the contact window C2. The sub-connecting line 7e is connected to the pad 10 in the upper layer (level 1) through the contact window C3. These pads 10 and 11 are connected by the line 9 formed in the upper layer (level 0) through the contact window C1. In this manner the sub-decoder 6h and the sub-select line 7e are connected.

As described above, the sub-select lines 7e to 7h can be cross-connected to the sub-decoders 6e to 6h by combining the uppermost wiring layer (level 0), the main select line layer (level 1), the bit line layer (level 2), and the sub-select line layer (level 3). The line 9 and the pads 10 and 11 can be formed together with a conductive film in the same hierarchical layer.

In the first embodiment of the present invention as described above, connecting lines are switched in connecting portions between sub-select lines and sub-decoders, since the order of selection reverses itself in accordance with redundancy/non-redundancy owing to the mirror arrangement of sub-decoders. This allows selection similar to that in a shift arrangement.

That is, in this first embodiment, adjacent sub-decoder groups have a mirror relationship, and the order of extraction of all sub-select lines from sub-decoders on the mirror arrangement side is reversed in connecting portions to the cell array. Since transistors forming the sub-decoders remain mirror-arranged, these transistors can be aligned in the pitch direction. So, the existing configuration shown in FIG. 6A can be used.

As shown in FIG. 8A, four connecting lines are switched by combining the three layers, i.e., the main select line layer, the bit line layer, and the uppermost wiring layer. Since this completely shifts the arrangement of sub-select lines, it is possible to prevent a selection order difference resulting from redundancy/non-redundancy during testing/evaluation.

Accordingly, in the aforementioned first embodiment, when a mirror arrangement is employed to achieve scale down and the like of a semiconductor memory, the order of selection of sub-select lines can be made proper even if defects are remedied by a shift redundancy system. Additionally, it is unnecessary to check each individual defect address whenever testing/evaluation is performed or to pre-store defect addresses and address logical arithmetic expressions. This reduces the time required for testing/evaluation during the fabrication and reduces the storage area. Consequently, the memory fabrication cost can be reduced.

In this embodiment, of the two adjacent mirror-arranged sub-decoder groups 6A and 6B, the connections between the sub-decoders 6e to 6h belonging to the sub-decoder group 6B on the mirror arrangement side and the sub-select lines 7e to 7h are switched so that these sub-select lines 7e to 7h are selected in order in a certain direction. However, it is also possible to switch the connections between the sub-decoders 6a to 6d belonging to the sub-decoder group 6A arranged on the regular side and the sub-select lines 7a to 7d.

Second Embodiment

The second embodiment of the present invention will be described below with reference to drawings. The difference of this second embodiment from the first embodiment is the connections of sub-select lines 7a to 7h to sub-decoder groups 6A and 6B. The rest of the arrangement of SDRAM is the same as the first embodiment, so the detailed description thereof will be omitted.

FIG. 6C is an enlarged plan view showing connecting portions between sub-decoders 6a to 6h and the sub-select lines 7a to 7h. Selection of the sub-select lines 7a to 7h connected to the two adjacent sub-decoder groups 6A and 6B will be described below with reference to FIG. 6C.

In this second embodiment, as shown in FIG. 6C, the sub-select lines 7a and 7d are cross-connected to two sub-decoders 6a and 6d in the sub-decoder group 6A. That is, the sub-select line 7d is connected to the sub-decoder 6a, and the sub-select line 7a is connected to the sub-decoder 6d. Also, the sub-select lines 7f and 7g are cross-connected to two sub-decoders 6f and 6g in the sub-decoder group 6B; the sub-select line 7g is connected to the sub-decoder 6f, and the sub-select line 7f is connected to the sub-decoder 6g. The connections of the sub-select lines 7b, 7c, 7e, and 7h to the other sub-decoders 6b, 6c, 6e, and 6h are the same as in the comparative example shown in FIG. 6A.

In the second embodiment, input address signals to the sub-decoders are also switched unlike in the comparative example. That is, this second embodiment differs from the comparative example of FIG. 6A in that address signal <0> is input to the sub-decoders 6d and 6e, and address signal <6> is input to the sub-decoders 6a and 6h. Address signals <2> and <4> are input to the sub-decoders 6b and 6g and the sub-decoders 6c and 6f, respectively, as in the comparative example.

That is, in the input and output portions of the sub-decoders 6e to 6h, connections to the sub-select lines 7e to 7h are switched such that the sub-select lines are selected in order in a certain direction when address incrementing is performed. Accordingly, in the sub-decoder group 6A, the sub-select line 7a connected to the sub-decoder 6d is selected by address signal <0>. Also, the sub-select line 7b connected to the sub-decoder 6b is selected by address signal <2>. Likewise, the sub-select line 7c connected to the sub-decoder 6c is selected by address signal <4>. The sub-select line 7d connected to the sub-decoder 6a is selected by address signal <6>.

In the sub-decoder group 6B, the sub-select line 7e connected to the sub-decoder 6e is selected by address signal <0>. Also, the sub-select line 7f connected to the sub-decoder 6g is selected by address signal <2>. Likewise, the sub-select line 7g connected to the sub-decoder 6f is selected by address signal <4>. The sub-select line 7h connected to the sub-decoder 6h is selected by address signal <6>.

Accordingly, when the sub-decoder group 6A is selected and sequentially given address signals <0>, <2>, <4>, and <6> and then the sub-decoder group 6B is selected and sequentially given address signals <0>, <2>, <4>, and <6> as in the first embodiment, the sub-select lines 7a to 7d are selected in the order indicated by an arrow C, and subsequently the sub-select lines 7e to 7h are selected in order in the same direction (arrow D).

As described above, in the sub-decoder group 6A, the sub-select lines 7a and 7d are cross-connected to the sub-decoders 6a and 6d, and input signals <0> and <6> to these sub-decoders 6a and 6d are switched. In the sub-decoder group 6B, the sub-select lines 7f and 7g are cross-connected to the sub-decoders 6f and 6g, and input signals <0> and <6> to these sub-decoders 6e and 6h are switched. Consequently, in the adjacent sub-decoder groups 6A and 6B, sub-select lines in corresponding positions are selected on the basis of the same input address signal.

Figure 9A:
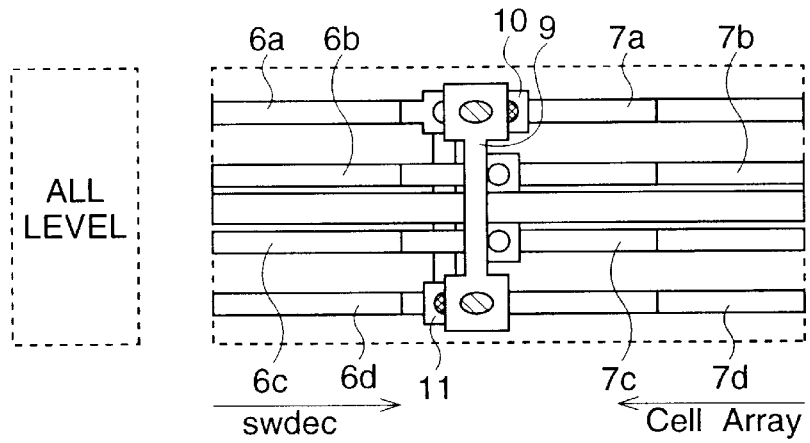
FIGS. 9A and 9B are plan views showing practical connecting portions between sub-decoder groups and sub-select lines in the second embodiment.
Figure 9B:
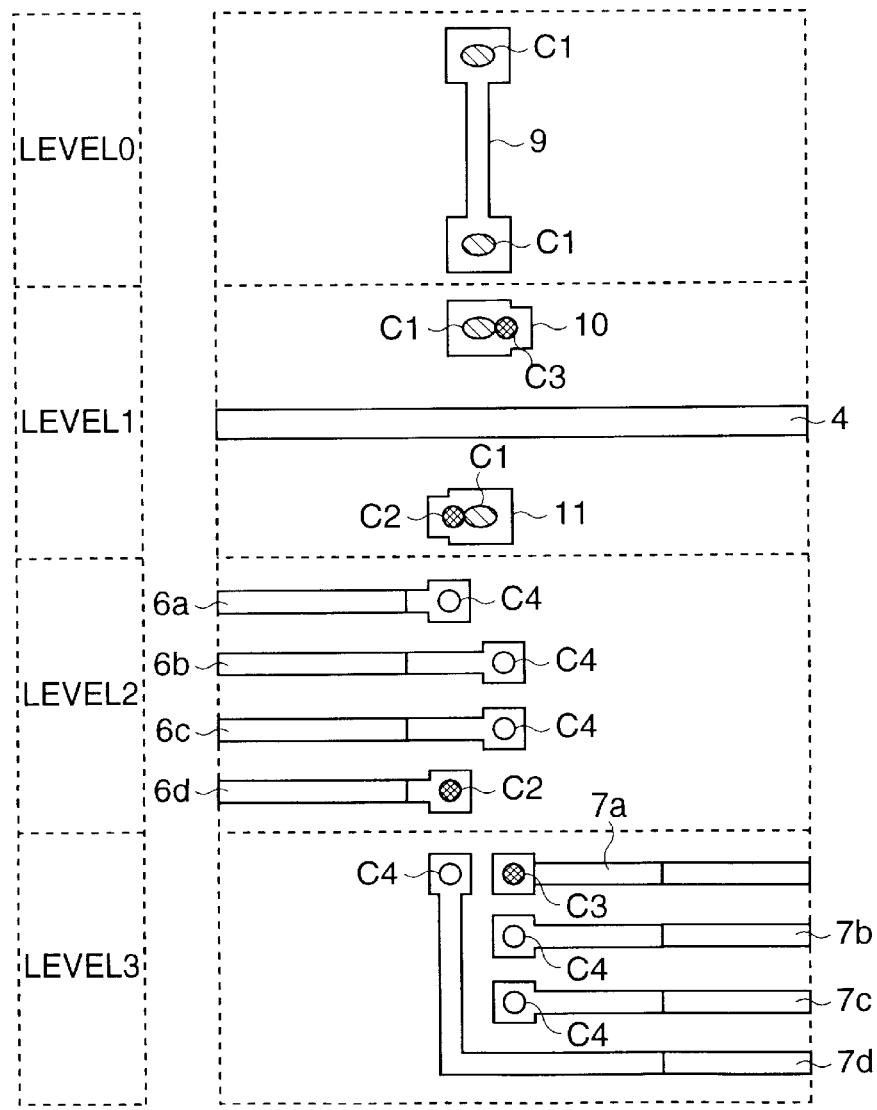

FIGS. 9A and 9B are plan views showing practical connecting portions of the sub-select lines 7a to 7d with respect to the sub-decoder group 6A shown in FIG. 6C. FIG. 9A is a plan view showing all hierarchical layers (all levels) of the connecting portions from the above. FIG. 9B is a plan view showing individual hierarchical layers (levels 0 to 3). The positions of the individual hierarchical layers and two hierarchical layers connected by each of contact windows C1 to C4 are the same as in the first embodiment.

As shown in FIG. 9B, the four sub-select lines 7a to 7d are formed in the same hierarchical layer (level 3) and connected to the sub-decoders 6a to 6d formed in the same hierarchical layer (level 2) above these sub-select lines 7a to 7d. Since the sub-decoder 6a is connected to the sub-select line 7d, this sub-select line 7d bends into an L shape to run up to a portion below the connecting line of the sub-decoder 6a. At the end of this sub-select line 7d, the contact window C4 forms a vertical contact.

Although the sub-decoder 6d is connected to the sub-select line 7a, the sub-decoders 6a to 6c interfere with this connection. Hence, the sub-decoder 6d and the sub-select line 7a are connected through a line 9 formed in the uppermost hierarchical layer (level 0) and pads 10 and 11 formed in the hierarchical layer (level 1) below level 0. That is, the sub-decoder 6d is connected to the pad 11 in the upper layer (level 1) through the contact window C2. The sub-connecting line 7a is connected to the pad 10 in the upper layer (level 1) through the contact window C3. These pads 10 and 11 are connected by the line 9 formed in the upper layer (level 0) through the contact window C1. In this manner, the sub-decoder 6d and the sub-select line 7a are connected. The sub-decoders 6b and 6c and the sub-connecting lines 7b and 7c are not cross-connected. So, at the end portion of each of these parts, the contact window C4 forms a contact.

Figure 10A:
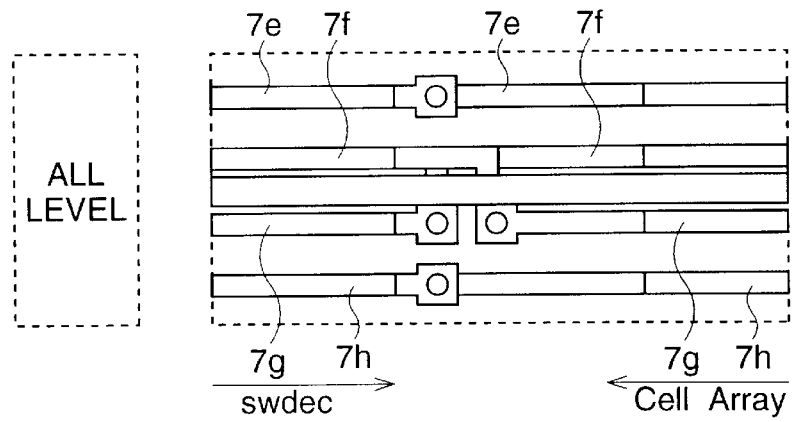
FIGS. 10A and 10B are plan views showing practical connecting portions between sub-decoder groups and sub-select lines in the second embodiment.
Figure 10B:
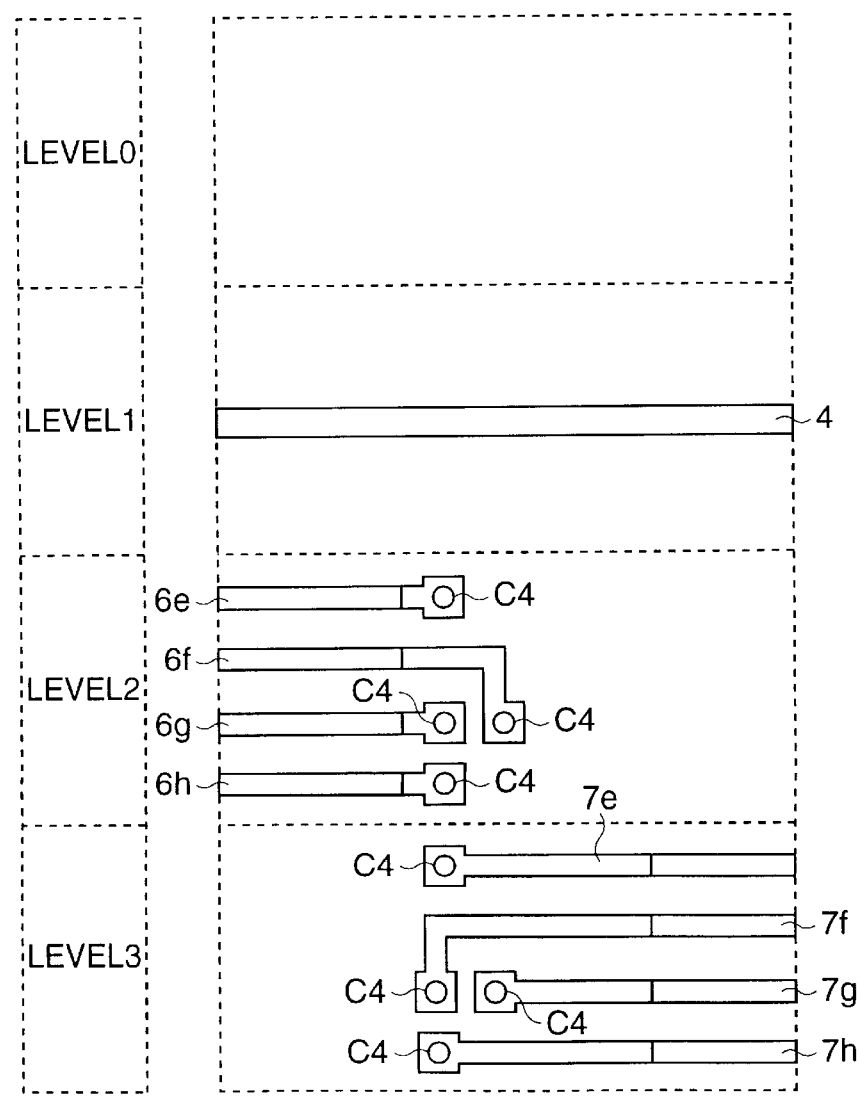

FIGS. 10A and 10B are plan views showing practical connecting portions of the sub-select lines 7e to 7h with respect to the sub-decoder group 6B shown in FIG. 6C. FIG. 10A is a plan view showing all hierarchical layers (all levels) of the connecting portions from the above. FIG. 10B is a plan view showing individual hierarchical layers (levels 0 to 3). The positions of the individual hierarchical layers and two hierarchical layers connected by each of contact windows C1 to C4 are the same as in FIGS. 9A and 9B.

As shown in FIG. 10A, the four sub-select lines 7e to 7h are formed in the same hierarchical layer (level 3) and connected to the sub-decoders 6e to 6h formed in the same hierarchical layer (level 2) above these sub-select lines 7e to 7h. Since the sub-decoder 6g is connected to the sub-select line 7f, this sub-select line 7f bends into an L shape to run up to a portion below the connecting line of the sub-decoder 6g. At the end of this sub-select line 7f, the contact window C4 forms a vertical contact.

Also, the sub-decoder 6f is connected to the sub-connecting line 7g, so the connecting line of this sub-decoder 6f bends into an L shape to run up to a portion above the sub-connecting line 7g. At the end of this connecting line, the contact window C4 forms a vertical contact. The sub-decoders 6e and 6h and the sub-connecting lines 7e and 7h are not cross-connected. Therefore, at the end portion of each of these parts, the contact window C4 forms a contact.

As described above, by combining the uppermost wiring layer (level 0), the main select line layer (level 1), the bit line layer (level 2), and the sub-select line layer (level 3), the sub-select lines 7a and 7d can be cross-connected to the sub-decoders 6a and 6d, and the sub-connecting lines 7f and 7g can be cross-connected to the sub-decoders 6f and 6g. The line 9 and the pads 10 and 11 can be formed together with a conductive film in the same hierarchical layer.

In the second embodiment of the present invention as described above, the adjacent sub-decoder groups 6A and 6B are arranged to have a mirror relationship. In the sub-decoder group 6A on the regular arrangement side, two input signals connected to the sub-decoders 6a and 6d are switched. Also, in connecting portions to the cell array, the connections of the sub-select lines 7a and 7d to the sub-decoders 6a and 6d whose input signals are switched are switched. In the sub-decoder group 6B on the mirror arrangement side, input signals to the two outside sub-decoders 6e and 6h are switched. Also, in connecting portions to the cell array, the connections of the sub-select lines 7f and 7g to the sub-decoders 6f and 6g whose input signals are not switched are switched.

As described above, by switching two input signals to each of the sub-decoder groups 6A and 6B and switching two sub-select lines in connecting portions to the cell array in each of the sub-decoder groups 6A and 6B, an effect equivalent to that of the first embodiment can be obtained without switching all four sub-connecting lines on the mirror arrangement side. As in the first embodiment, transistors forming the sub-decoders remain mirror-arranged, so these transistors can be aligned in the pitch direction. Therefore, the existing configuration shown in FIG. 6A can be used.

As shown in FIGS. 9A, 9B, 10A, and 10B, two inside connecting lines in the sub-decoder group 6B are switched by combining the sub-select line layer and the bit line layer. Also, two outside connecting lines in the sub-decoder group 6A are switched by combining the main select line layer, the bit line layer, and the uppermost wiring layer. Since this completely shifts the arrangement of sub-select lines, it is possible to prevent a selection order difference resulting from redundancy/non-redundancy during testing/evaluation.

Accordingly, in the aforementioned second embodiment, when a mirror arrangement is employed to achieve scale down and the like of a semiconductor memory, the order of selection of sub-select lines can be made proper even if defects are remedied by a shift redundancy system. Additionally, it is unnecessary to check each individual defect address whenever testing/evaluation is performed or to pre-store defect addresses and address logical arithmetic expressions. This reduces the time required for testing/evaluation during the fabrication and reduces the storage area. Consequently, the memory fabrication cost can be reduced.

Furthermore, in the second embodiment, it is unnecessary to switch the connections of sub-select lines to all decoders in sub-decoder groups. This can minimize the space required by switching of the connections. That is, in the first embodiment, a maximum of three contact windows are juxtaposed in the direction of select lines as indicated by level 2 or level 3 in FIG. 8B. By contrast, in this second embodiment shown in FIGS. 9A, 9B, 10A, and 10B, a maximum of two contact windows need only be formed in this direction, so the area of these contact windows can be reduced accordingly.

Third Embodiment

The third embodiment of the present invention will be described below with reference to drawings. The difference of this third embodiment from the first embodiment is the connections of input address signals to a sub-decoder group 6B. The rest of the arrangement of SDRAM is the same as the first embodiment, so the detailed description thereof will be omitted.

Figure 6D:
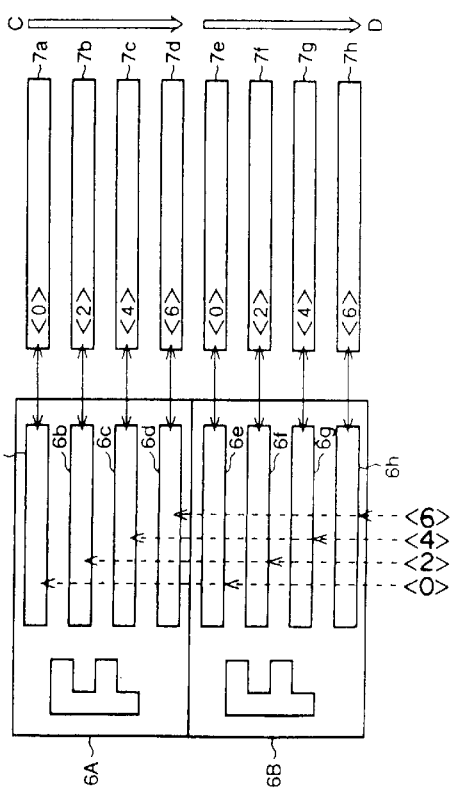

FIG. 6D is an enlarged plan view showing connecting portions between sub-decoders 6a to 6h and sub-select lines 7a to 7h. Selection of the sub-select lines 7a to 7h connected to two adjacent sub-decoder groups 6A and 6B will be described below with reference to FIG. 6D.

In this third embodiment, the sub-decoder group 6B is formed by a shift arrangement, rather than a mirror arrangement, with respect to the sub-decoder group 6A. Therefore, input address signals to the sub-select lines 7e to 7f connected to the sub-decoder group 6B are identical with input address signals to the sub-select lines 7a to 7d connected to the sub-decoder group 6A.

Accordingly, in the sub-decoder group 6A, the sub-select line 7a connected to the sub-decoder 6a is selected by address signal <0>. Also, the sub-select line 7b connected to the sub-decoder 6b is selected by address signal <2>. Likewise, the sub-select line 7c connected to the sub-decoder 6c is selected by address signal <4>. The sub-select line 7d connected to the sub-decoder 6d is selected by address signal <6>.

In the sub-decoder group 6B, the sub-select line 7e connected to the sub-decoder 6e is selected by address signal <0>. Also, the sub-select line 7f connected to the sub-decoder 6f is selected by address signal <2>. Likewise, the sub-select line 7g connected to the sub-decoder 6g is selected by address signal <4>. The sub-select line 7h connected to the sub-decoder 6h is selected by address signal <6>.

Accordingly, when the sub-decoder group 6A is selected and sequentially given address signals <0>, <2>, <4>, and <6> and then the sub-decoder group 6B is selected and sequentially given address signals <0>, <2>, <4>, and <6> as in the first embodiment, the sub-select lines 7a to 7d are selected in the order indicated by an arrow C, and subsequently the sub-select lines 7e to 7h are selected in order in the same direction (arrow D).

In the third embodiment of the present invention as described above, transistors constituting the sub-decoder group 6B are shifted with respect to those of the sub-decoder group 6A. Consequently, without crossing the connections of the sub-select lines 7a to 7h to the sub-decoders 6a to 6h, it is possible to prevent a selection order difference resulting from redundancy/non-redundancy during testing/evaluation as in the first embodiment. Therefore, an effect similar to that of the first embodiment can be obtained. Additionally, even when the mirror arrangement of decoders has an inhibiting factor, the order of selection of sub-select lines can be made proper.

In each of the above embodiments, the connection between each sub-decoder and each sub-select line is explained. However, when main decoders are mirror-arranged, the present invention is also applicable to the connection between each main decoder and each main select line. Furthermore, the present invention can be applied not only to a semiconductor memory using a hierarchical word line system but also to a device in which adjacent decoders are mirror-arranged.

Also, the configuration of each component, the wiring, and the like presented in each of the above embodiments merely indicate practical examples for practicing the present invention, so the technical scope of the present invention should not be limitedly interpreted by these examples. That is, the present invention can be practiced in various forms without departing from the spirit and principal features of the invention.

What is claimed is:

1. A semiconductor memory comprising:

select lines coupled to memory cells;

decoders for selecting one of said select lines; and connection lines, each connected between one of said select lines and one of output nodes of said decoders, wherein at least two of said connection lines are cross coupled such that position of selected one of said select lines is shifted in order along a first direction in response to shifting an address signal.

2. The semiconductor memory as claimed in claim 1, wherein said decoders includes a first and second decoder group which are adjacent each other and arranged to have a mirror image relationship.

3. The semiconductor memory as claimed in claim 2, wherein said connection lines includes first and second connection lines, said first connection lines connected between corresponding said select lines and said first decoder group and said second connection lines connected between corresponding said select lines and said second decoder group, and wherein at least part of said first connection lines and at least part of said second connection lines are cross coupled.

4. The semiconductor memory as claimed in claim 2, further comprising:

main select lines, each selectively coupling one of said select lines, wherein said first decoder group comprises first decoders connected to one of said main select lines, and said second decoder group comprises second decoders connected to another one of said main select lines.

5. The semiconductor memory as claimed in claim 1, wherein the semiconductor memory having a first wiring layer and a second wiring layer arranged above the first wiring layer, and said two of said connection lines are disposed at said first and second wiring layer respectively.

6. A semiconductor memory comprising:

word lines coupled to memory cells;

word decoders for selecting said word lines; and connection lines, each connected between an output node of corresponding one of said word decoders and corresponding one of said word lines, wherein at least two of said connection lines are cross coupled each other.

7. The semiconductor memory as claimed in claim 6, wherein said at least two of said connection lines are cross coupled such that position of selected word line is sequentially shifted in response to shift of an address signal.

8. The semiconductor memory as claimed in claim 7, further comprising:

main word lines, wherein said word decoders selectively connect corresponding word lines with said main word lines in response to selection signals.

9. A semiconductor memory comprising:

first word lines coupled to corresponding memory cells;

second word lines coupled to corresponding memory cells;

a first decoder group including first word decoders for selecting said first word lines;

a second decoder group including second word decoders for selecting said second word lines;

first connection lines, each connected between an output node of corresponding one of said first word decoders and corresponding one of said first word lines, second connection lines, each connected between an output node of corresponding one of said second word decoders and corresponding one of said second word lines, wherein at least two among said first and second connection lines are cross coupled each other.

10. The semiconductor memory as claimed in claim 9, wherein said at least two among said first and second connection lines are cross coupled such that position of selected word line is sequentially shifted in response to shift of an address signal.

11. The semiconductor memory as claimed in claim 9, wherein at least two of either of said first connection lines or said second connection lines are cross coupled each other.

12. The semiconductor memory as claimed in claim 9, wherein at least two of said first connection lines and at least two of said second connection lines are cross coupled each other.

13. The semiconductor memory as claimed in claim 9, wherein said first and second decoder group are arranged to have a mirror image relationship.

14. The semiconductor memory as claimed in claim 13, wherein said semiconductor memory includes a memory cell array in which said word lines are located, and wherein said first and second decoder group are disposed on both side of said memory cell array.

* * * * *